United States Patent [19]

Sandhu et al.

[11] Patent Number: 5,665,611
[45] Date of Patent: Sep. 9, 1997

[54] METHOD OF FORMING A THIN FILM TRANSISTOR USING FLUORINE PASSIVATION

[75] Inventors: Gurtej S. Sandhu; Shubneesh Batra; Pierre C. Fazan, all of Boise, Id.

[73] Assignee: Micron Technology, Inc., Boise, Id.

[21] Appl. No.: 594,127

[22] Filed: Jan. 31, 1996

[51] Int. Cl.⁶ .................................. H01L 21/84
[52] U.S. Cl. .................. 438/162; 438/143; 438/476
[58] Field of Search .................. 437/21, 40–41, 437/937, 980, 155, 160

[56] References Cited

U.S. PATENT DOCUMENTS

| 4,945,065 | 7/1990 | Gregory et al. | 437/4 |
|---|---|---|---|
| 5,212,108 | 5/1993 | Liu et al. | 437/60 |
| 5,320,975 | 6/1994 | Cederbaum et al. | 437/44 |
| 5,334,861 | 8/1994 | Pfiester et al. | 257/67 |
| 5,373,170 | 12/1994 | Pfiester et al. | 257/69 |
| 5,411,909 | 5/1995 | Manning et al. | 437/52 |
| 5,418,393 | 5/1995 | Hayden | 257/347 |
| 5,523,240 | 6/1996 | Zhang et al. | 437/21 |

FOREIGN PATENT DOCUMENTS

| 281054A1 | 7/1990 | Germany | 437/980 |
|---|---|---|---|

OTHER PUBLICATIONS

Pollack, G.P. et al., "Hydrogen Passivation of Polysilicon MOSFET's From A Plasma Nitride Source", IEEE, 1984 pp. 408–410, month unknown.

Kamins, T.I., "Hydrogenation of Transistors Fabricated in Polycrystalline–Silicon Films", IEEE, 1980, pp. 159–161, month unknown.

Seager, C.H. et al., "Studies of the hydrogen passivation of silicon grain boundaries", J.Appl. Phys. 52, Feb. 1981, pp. 1050–1055.

Kitajima, H. et al., "Leakage Current Reduction in Sub-Micron Channel Poly-Si TFTs", Extended Abstract—1991 International Conference on Solid State Devices and Materials, Yokohama, 1991, pp. 174–176, month unknown.

Sunada, Takeshi et al., "The Role of Fluorine Termination in the Chemical Stability of HF–Treated Si Surfaces", Dept. of Electrical Engineering, Hiroshima University, Higashi-Hiroshima 724, Accepted for Publication 1990, month unknown.

*Primary Examiner*—John Niebling
*Assistant Examiner*—Richard A. Booth
*Attorney, Agent, or Firm*—Wells, St. John, Roberts, Gregory & Matkin, P.S.

[57] ABSTRACT

A method of forming a thin film transistor relative to a substrate includes, a) providing a thin film transistor layer of polycrystalline material on a substrate, the polycrystalline material comprising grain boundaries; b) providing a fluorine containing layer adjacent the polycrystalline thin film layer; c) annealing the fluorine containing layer at a temperature and for a time period which in combination are effective to drive fluorine from the fluorine containing layer into the polycrystalline thin film layer and incorporate fluorine within the grain boundaries to passivate said grain boundaries; and d) providing a transistor gate operatively adjacent the thin film transistor layer. The thin film transistor can be fabricated to be bottom gated or top gated. A buffering layer can be provided intermediate the thin film transistor layer and the fluorine containing layer, with the buffering layer being transmissive of fluorine from the fluorine containing layer during the annealing. Preferably, the annealing temperature is both sufficiently high to drive fluorine from the fluorine containing layer into the polycrystalline thin film layer and incorporate fluorine within the grain boundaries to passivate said grain boundaries, but sufficiently low to prevent chemical reaction of the fluorine containing layer with the polycrystalline thin film layer.

29 Claims, 4 Drawing Sheets

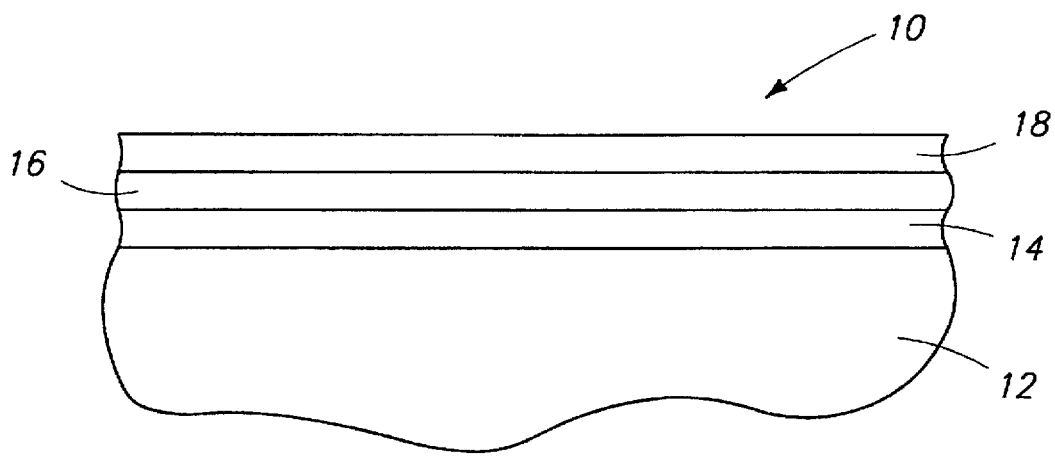
_Fig. 1_
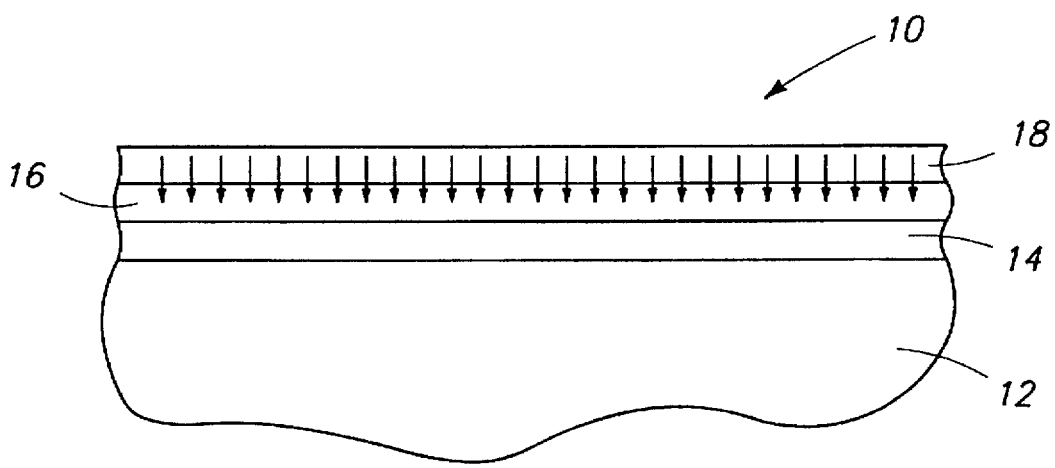
_Fig. 2_

METHOD OF FORMING A THIN FILM TRANSISTOR USING FLUORINE PASSIVATION

TECHNICAL FIELD

This relates to thin film transistors and to methods of forming thin film transistors.

BACKGROUND OF THE INVENTION

As circuit density continues to increase, there is a corresponding drive to produce smaller and smaller field effect transistors. Field effect transistors have typically been formed by providing active areas within a bulk substrate material or within a complementary conductivity type well formed within a bulk substrate. Although the field effect transistor feature size is reducing with advances in process technology, even greater packing density can be achieved by forming transistors in thin films deposited over insulating layers, such as oxide. These transistors are commonly referred to as "thin film transistors" (TFTs).

With TFTs, a thin film of semiconductive material is first provided. A central channel region of the thin film is masked, while opposing adjacent source/drain regions are doped with an appropriate p or n type conductivity enhancing impurity. A gate insulator and gate are provided either above or below the thin film channel region, thus providing a field effect transistor having an active channel region formed entirely within a thin film as opposed to a bulk substrate.

The invention grew out of needs associated with TFTs and their usage in high-density static random access memories (SRAMs) and flat panel displays. A static memory cell is characterized by operation in one of two mutually exclusive and cell-maintaining operating states. Each operating state defines one of the two possible binary bit values, 0 or 1. A static memory cell typically has an output which reflects the operating state of the memory cell. Such an output produces a "high" voltage to indicate a "set" operating state. The memory cell output produces a "low" voltage to indicate a "reset" memory cell operating state. A low or reset output voltage usually represents a binary value of 0, and a high or set output voltage represents a binary value of 1.

A static memory cell is said to be bi-stable because it has two stable or self-maintaining operating states, corresponding to two different output voltages. Without external stimuli, a static memory cell will operate continuously in a single one of its two operating states. It has internal feedback to maintain a stable output voltage, corresponding to operating states of the memory cell, as long as the memory cell receives power.

The operation of the static memory cell is in contrast to other types of memory cells, such as dynamic cells, which do not have stable operating states. A dynamic memory cell can be programmed to store a voltage which represents one of two binary values, but requires periodic reprogramming or "refreshing" to maintain this voltage for more than very short time periods. A dynamic memory cell has no feedback to maintain a stable output voltage. Without refreshing, the output of a dynamic memory cell will drift towards intermediate or indeterminate voltages, effectively resulting in loss of data.

Dynamic memory cells are used in spite of this limitation because of the significantly greater packaging densities which can be attained. For instance, a dynamic memory cell can be fabricated with a single MOSFET transistor, rather than the six transistors typically required in a static memory cell. SRAM cell density can be maximized with three-dimensional integration. For example, load transistors of the SRAM cell constitute TFTs which are folded over the bulk transistors. Because of the significantly different architectural arrangements and functional requirements of static and dynamic memory cells and circuits, static memory design has developed along a different path than has the design of dynamic memories.

Ongoing efforts in SRAM circuitry have brought about the development of TFTs in an attempt to minimize space and for other advantageous reasons associated with TFTs. While the invention grew out of needs associated with TFTs of SRAM circuitry, the artisan will appreciate applicability of the invention to other types of circuitry. By way of example only, such include TFT-based liquid crystal or other active matrix displays, where a TFT can be used as a pass transistor in a pixel element and also in the driver circuitry.

One common material utilized as the thin source, channel and drain film in a TFT is polysilicon. Such is comprised of multiple forms of individual single crystal silicon grains. The locations where two individual crystalline grains abut one another is commonly referred to as a grain boundary. Grain boundaries are inherent in polycrystalline materials, such as polysilicon, as it is the boundaries which define the breaks between individual crystal grains. The crystalline structure breaks down at the grain boundaries, giving rise to a high concentration of broken or "dangling" Si bonds. These dangling bonds "trap" carriers and give rise to potential barriers at the grain boundaries. These potential barriers impede the flow of carriers in polysilicon, thus reducing conductivity compared to bulk silicon.

The grain boundary potential barrier height is proportional to the square of the dangling bond density, or "trap density". The smaller the grain size, the higher the trap density and thus the lower the conductance. In a TFT, the grain boundary potential barrier height in the channel is controlled by the gate voltage, and hence the conductivity is a function of the gate voltage. The TFTs, however, have a lower drive compared to bulk transistors because of lower mobility in the channel and higher threshold voltage to the larger trap concentration.

The grain boundary trap concentration also affects the leakage current of OFF-current in TFTs. In polysilicon or other polycrystalline TFTs, the presence of grain boundary traps at the drain end can dramatically increase the leakage current in the presence of a "gate-to-drain" electric field. The increase in leakage results from either "thermionic field emission" and/or "Poole-Frenkel" emission through the grain boundary traps. Accordingly, the greater the number of grain boundaries (i.e., the smaller the grain size), the greater the current leakage through the material. Greater current leakage means that more power is required to replace the leaking current to maintain an SRAM cell transistor in its desired powered-on state. Such leakage is particularly adverse in laptop computers, where desired power consumption when a cell's state is not being changed would be desired to be very low to extend battery life.

High density SRAMs (16 Mb or higher) typically require TFTs with low OFF currents (<50 fA) and high ON current (>5 nA) in order to obtain acceptable low standby leakage and high memory cell stability. Current state-of-the-art TFTs provide low standby current at the expense of ON current, or at the expense of additional process complexity. One present way of minimizing this current leakage at the cost of increased process complexity is by providing a "lightly doped offset" (LDO) region within the thin film. A lightly doped offset region is an elongated region within the thin film which is positioned effectively between the channel region and the drain region which is not under "direct" control of the gate fields, but rather is affected by the gate's "fringing fields". Such a region provides a buffer zone for the electric field between the channel and drain which minimizes leakage therebetween.

One prior art manner of contending with problems associated with grains boundaries is to "passivate" such boundaries after their formation. One technique involves exposing the thin film polycrystalline layer to atomic or plasma hydrogen, with the intent being to tie-up the dangling Si bonds at the boundaries with hydrogen. An alternate technique is to implant fluorine into the thin film polycrystalline layer in an effort to produce silicon-fluorine bonds at the boundary interfaces. A silicon-fluorine bond is much more desirable than a silicon hydrogen bond due to increased high temperature stability. However, the existing ion implantation techniques of providing fluorine into a polycrystalline thin film is not without drawbacks. For example, the implantation undesirably damages the thin film layer and typically creates more dangling bonds inherent from the implantation process. Further, a large percentage of the fluorine does not reach the grain boundaries, even upon diffusion, and is therefore ineffective for the purpose of passivation, as ion implantation distributes the fluorine uniformly throughout the grains and grain boundaries.

BRIEF DESCRIPTION OF THE DRAWINGS

Preferred embodiments of the invention are described below with reference to the following accompanying drawings.

FIG. 1 is a diagrammatic sectional view of a wafer fragment at one processing step in accordance with the invention.

FIG. 2 is a view of the FIG. 1 wafer at a processing step subsequent to that shown by FIG. 1.

DETAILED DESCRIPTION OF THE PREFERRED EMBODIMENTS

Figure 3:
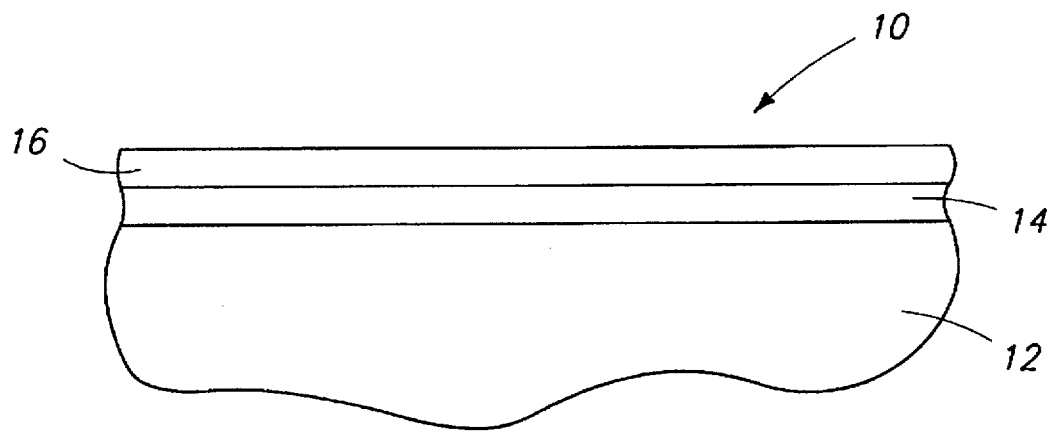
FIG. 3 is a view of the FIG. 1 wafer at a processing step subsequent to that shown by FIG. 2.

This disclosure of the invention is submitted in furtherance of the constitutional purposes of the U.S. Patent Laws "to promote the progress of science and useful arts" (Article 1, Section 8).

In accordance with one aspect of the invention, a method of forming a thin film transistor relative to a substrate comprises the following steps:

providing a thin film transistor layer of polycrystalline material on a substrate, the polycrystalline material comprising grain boundaries;

providing a fluorine containing layer adjacent the polycrystalline thin film layer;

annealing the fluorine containing layer at a temperature and for a time period which in combination are effective to drive fluorine from the fluorine containing layer into the polycrystalline thin film layer and incorporate fluorine within the grain boundaries to passivate said grain boundaries; and providing a transistor gate operatively adjacent the thin film transistor layer.

In accordance with another aspect of the invention, a method of forming a thin film transistor relative to a substrate comprises the following steps:

providing a thin film transistor layer of polycrystalline material on a substrate, the polycrystalline material comprising grain boundaries;

providing a sacrificial fluorine containing layer over the polycrystalline thin film layer;

annealing the fluorine containing layer at a temperature and for a time period which in combination are effective to drive fluorine from the fluorine containing layer into the polycrystalline thin film layer and incorporate fluorine within the grain boundaries to passivate said grain boundaries;

after annealing, etching the sacrificial layer from the polycrystalline thin film layer; and providing a gate dielectric layer and a gate relative to the passivated polycrystalline thin film layer.

Referring to FIGS. 1–4 and initially to FIG. 1, a semiconductor wafer fragment in process is indicated generally with reference numeral 10. Such comprises a bulk substrate region 12 and an overlying insulative layer 14. A thin film transistor layer 16 of polycrystalline material is provided relative to composite substrate 12/14. Such will comprise grain boundaries inherent in polycrystalline materials. A typical and preferred material for layer 16 is polysilicon, with other polycrystalline materials, such as germanium and silicon-germanium, also being contemplated.

A fluorine containing layer 18 is provided outwardly over polycrystalline thin film layer 16. Layer 18 preferably contains such fluorine as an excess of fluorine in the form of free or loosely associated fluorine atoms. An example and preferred material for layer 18 is $WSi_x$ provided by chemical vapor deposition utilizing $WF_6$ and $SiH_4$ as precursors. The fluorine from the $WF_6$ precursor will desirably be appreciably incorporated in layer 18 for use as described below. An example process for providing layer 18 by CVD using $WF_6$ and $SiH_4$ in a manner which maximizes incorporated fluorine includes $WF_6$ feed at 3 sccm, Ar at 500 sccm, $SiH_4$ at 300 sccm, T at 400° C. and a pressure of 1 Torr. Alternately by way of example only, fluorine containing layer 18 might predominantly comprise elemental W having incorporated fluorine, such as by utilizing a CVD process also using $WF_6$ as a precursor. Regardless where layer 18 is to predominantly comprise W or a W compound, $WF_6$ is a pre precursor for providing fluorine within such layer.

Referring to FIG. 2, wafer fragment 10 and thereby fluorine containing layer 18 is subjected to a suitable annealing temperature for a time period which in combination are effective to drive fluorine from fluorine containing layer 18 into polycrystalline thin film layer 16. Such fluorine will be incorporated within the grain boundaries to passivate said grain boundaries. The principal mechanism by which such fluorine transports from layer 18 to 16 is understood to be predominantly physical (diffusion), as opposed to by chemical action. Alternately but less preferred, such fluorine displacement from layer 18 to layer 16 might occur by a chemical mechanism. However most preferably, the annealing temperature and time are selected to be sufficiently great to drive fluorine from layer 18 into polycrystalline layer 16, but also sufficiently low to prevent a chemical reaction of layer 18 with layer 16.

For example where layer 18 predominantly comprises elemental tungsten, an annealing temperature is preferably less than 700° C. to prevent the top or a substantial portion of layer 16 from being reacted with layer 18 to form $WSi_x$. Typical and example preferred annealing temperatures for a $WSi_x$ or other as-deposited layer 18 which has reaction resistance with respect to polycrystalline material of layer 16 is from about 600° C. to 1000° C. for anywhere from 5 seconds (rapid thermal processing) to greater than one hour. The incorporated fluorine within layer 16 preferably forms Si—F bonds with the dangling bonded silicon atoms inherent at the grain boundaries.

Referring to FIG. 3 and after annealing, fluorine containing layer 18 is preferably etched from outwardly of passivated polycrystalline thin film layer 16, thereby being sacrificial. An example etch chemistry where layer 18 predominately comprises $WSi_x$ is a combination of hydrogen peroxide and ammonium hydroxide.

Figure 4:
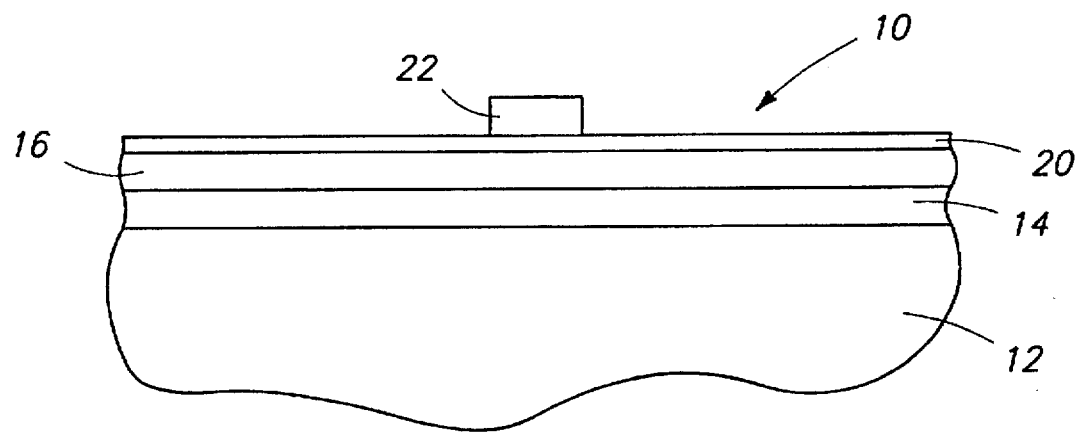
FIG. 4 is a view of the FIG. 1 wafer at a processing step subsequent to that shown by FIG. 3.

Referring to FIG. 4, subsequently a gate dielectric layer 20 is provided, along with a gate 22 outwardly relative to passivated polycrystalline thin film layer 16. Source, drain, offset, Vt adjust, or other implants would ultimately be provided to produce the desired TFT construction. Such are not shown or otherwise described, as such do not constitute aspects pertinent to the claimed invention.

Figure 5:
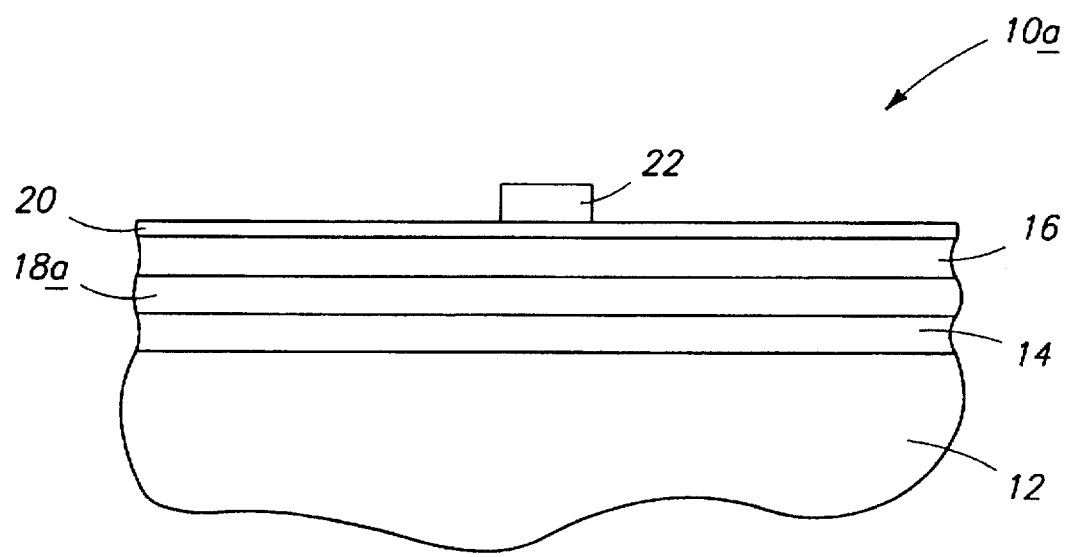
FIG. 5 is a diagrammatic sectional view of another wafer fragment at one processing step in accordance with the invention.

The above described embodiment was described with reference to fluorine containing layer 18 being both sacrificial and provided after thin film transistor layer 16 was provided. FIG. 5 illustrates an alternate embodiment of a wafer fragment 10a where a fluorine containing layer 18a is neither sacrificial nor provided after provision of a thin film polycrystalline layer. Like numerals from the first described embodiment are utilized where appropriate, with differences being indicated by the suffix "a" or with different numerals. Here, fluorine containing layer 18a is provided intermediate underlying insulating layer 14 and overlying thin film polycrystalline layer 16. If fluorine containing layer 18a were electrically conductive, a fluorine transmissive electrical insulating layer (i.e., a 50–100 Angstroms of $SiO_2$) can be provided intermediate layers 18a and 16. The selected anneal conditions (for example those described above) will effectively move fluorine atoms from layer 18a into layer 16 to provide the passivating effect. Layer 18a would then remain after passivation.

Figure 6:
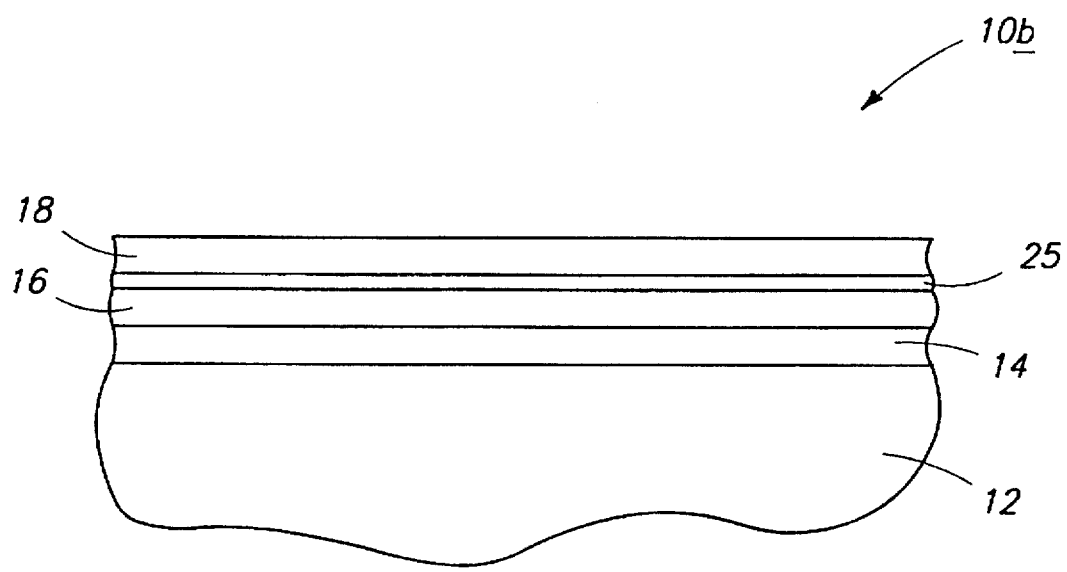
FIG. 6 is a diagrammatic sectional view of still another wafer fragment at one processing step in accordance with the invention.

Another alternate embodiment wafer fragment 10b and associated processing is described with reference to FIGS. 6 and 7. Like numerals from the first described embodiment are utilized where appropriate, with differences being indicated with the suffix "b" or with different numerals. FIG. 6 is of the same essential composition as the fragment of FIG. 1, but for provision of a buffering layer 25 intermediate thin film transistor layer 16 and fluorine containing layer 18. Buffering layer 25 can be provided to provide etch selectivity of layer 18 relative to 16, and as may be desired to protect the outer surface of layer 16 relative to contact with layer 18. An example and preferred material for layer 25 is an insulating material, such as $SiO_2$ deposited to a thickness of from about 50 Angstroms to about 200 Angstroms. In such instance however, buffering layer 25 will be transmissive of fluorine atoms from fluorine containing layer 18 during the annealing step.

Figure 7:
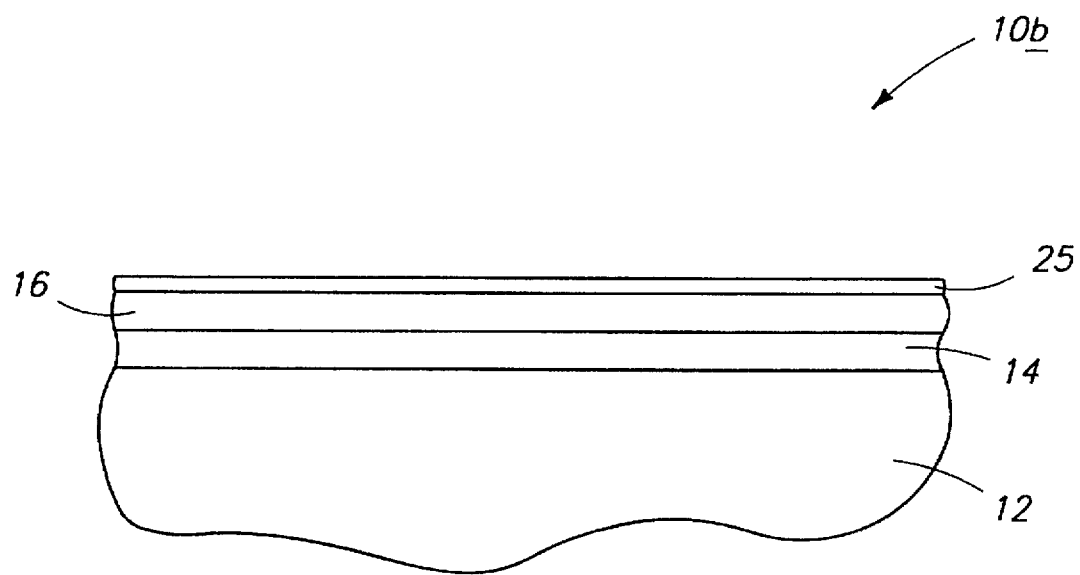
FIG. 7 is a view of the FIG. 6 wafer at a processing step subsequent to that shown by FIG. 6.

Referring to FIG. 7, fluorine containing layer is illustrated as having been selectively etched relative to buffering layer 25 after driving of the fluorine atoms into layer 16. Buffering layer 25 would typically subsequently be etched, and processing continuing to occur as shown by FIG. 4 to produce a thin film transistor construction.

Figure 8:
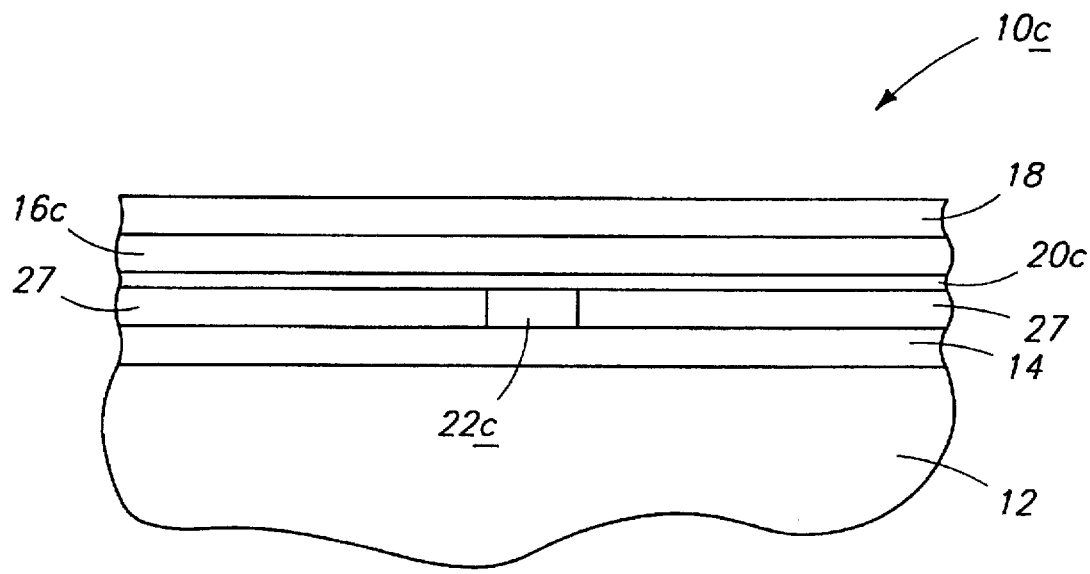
FIG. 8 is a diagrammatic sectional view of still a further wafer fragment at one processing step in accordance with the invention.

The above described embodiments were with respect to a top-gated thin film transistor construction. FIG. 8 illustrates yet another alternate embodiment whereby a bottom-gated thin film construction is provided. Like numerals from the first described embodiment are utilized where appropriate, with differences being indicated by the suffix "c" or with different numerals. Here, wafer fragment 10c is illustrated as having a bottom gate 22c provided relative to an insulating layer 27, such as $SiO_2$. Gate dielectric layer 20c and thin film transistor layer 16c are provided outwardly relative to layer 27 and gate 22c. A fluorine containing layer 18 is provided outwardly of polycrystalline thin film layer 16c for the annealing step. Also, a buffering layer could be provided intermediate thin film transistor layer 16c and fluorine containing layer 18.

Regardless and in all of the above described embodiments, a fluorine containing layer is provided operatively adjacent a polycrystalline thin film layer in a manner effective to enable an effective annealing temperature and time to transfer fluorine atoms from the fluorine containing layer to the polycrystalline thin film layer. Further and regardless, in each of the above embodiments at some point a transistor gate is provided operatively adjacent the thin film transistor layer. Further, subsequent hydrogen passivation could also be conducted without departing from the principals and scope of the invention.

Thin film transistors produced according to the above described embodiment have improved operating characteristics.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming a thin film transistor relative to a substrate comprising the following steps:

forming a thin film transistor layer of polycrystalline material on a substrate, the polycrystalline material comprising grain boundaries;

forming a fluorine containing layer adjacent the polycrystalline thin film layer;

annealing the fluorine containing layer at a temperature and for a time period which in combination are effective to drive fluorine from the fluorine containing layer into the polycrystalline thin film layer and form Si—F bonds at the grain boundaries to passivate said grain boundaries; and forming a transistor gate operatively adjacent the thin film transistor layer.

2. The method of forming a thin film transistor of claim 1 wherein the thin film transistor layer is provided before the fluorine containing layer is provided.

3. The method of forming a thin film transistor of claim 1 wherein the thin film transistor layer is provided after the fluorine containing layer is provided.

4. The method of forming a thin film transistor of claim 1 wherein the fluorine containing layer predominately comprises $WSi_x$.

5. The method of forming a thin film transistor of claim 1 wherein the annealing temperature is from about 600° C. to about 1000° C.

6. A method of forming a thin film transistor relative to a substrate comprising the following steps:
   providing a thin film transistor layer of polycrystalline material on a substrate, the polycrystalline material comprising grain boundaries;
   providing a sacrificial fluorine containing layer over the polycrystalline thin film layer;
   annealing the fluorine containing layer at a temperature and for a time period which in combination are effective to drive fluorine from the fluorine containing layer into the polycrystalline thin film layer and incorporate fluorine within the grain boundaries to passivate said grain boundaries;
   after annealing, etching the sacrificial layer from the polycrystalline thin film layer; and
   providing a gate dielectric layer and a gate relative to the passivated polycrystalline thin film layer.

7. The method of forming a thin film transistor of claim 6 wherein the gate dielectric layer and gate are provided after etching the sacrificial layer.

8. The method of forming a thin film transistor of claim 6 wherein the gate dielectric layer and gate are provided before etching the sacrificial layer.

9. The method of forming a thin film transistor of claim 6 wherein the gate dielectric layer and gate are provided before providing the sacrificial layer.

10. The method of forming a thin film transistor of claim 6 wherein the fluorine containing layer predominately comprises $WSi_x$.

11. The method of forming a thin film transistor of claim 6 wherein the fluorine containing layer predominately comprises elemental W.

12. The method of forming a thin film transistor of claim 6 wherein the fluorine containing layer comprises W, and is deposited by chemical vapor deposition using $WF_6$ as a precursor.

13. The method of forming a thin film transistor of claim 6 wherein the annealing temperature is from about 600° C. to about 1000° C.

14. The method of forming a thin film transistor of claim 6 wherein the annealing temperature is less than 700° C.

15. The method of forming a thin film transistor of claim 6 further comprising providing a buffering layer intermediate the thin film transistor layer and the fluorine containing layer, the buffering layer being transmissive of fluorine from the fluorine containing layer during the annealing step, the method further comprising etching the buffering layer from outwardly of the polycrystalline thin film layer after the step of etching the fluorine containing layer.

16. The method of forming a thin film transistor of claim 6 further comprising providing a buffering layer intermediate the thin film transistor layer and the fluorine containing layer, the buffering layer being transmissive of fluorine from the fluorine containing layer during the annealing step, the buffering layer having a thickness of less than or equal to about 200 Angstroms, the method further comprising etching the buffering layer from outwardly of the polycrystalline thin film layer after the step of etching the fluorine containing layer.

17. A method of forming a thin film transistor relative to a substrate comprising the following steps:

forming a thin film transistor layer of polycrystalline material on a substrate, the polycrystalline material comprising grain boundaries;

forming a fluorine containing layer adjacent the polycrystalline thin film layer; and annealing the fluorine containing layer at a temperature sufficiently high to drive fluorine from the fluorine containing layer into the polycrystalline thin film layer and form Si—F bonds at the grain boundaries to passivate said grain boundaries but sufficiently low to prevent chemical reaction of the fluorine containing layer with the polycrystalline thin film layer.

18. The method of forming a thin film transistor of claim 17 wherein the thin film transistor layer is provided before the fluorine containing layer is provided.

19. The method of forming a thin film transistor of claim 17 wherein the thin film transistor layer is provided after the fluorine containing layer is provided.

20. The method of forming a thin film transistor of claim 17 wherein the fluorine containing layer predominately comprises $WSi_x$.

21. A method of forming a thin film transistor relative to a substrate comprising the following steps:
   providing a thin film transistor layer of polycrystalline material on a substrate, the polycrystalline material comprising grain boundaries;
   providing a fluorine containing layer adjacent the polycrystalline thin film layer, the fluorine containing layer predominately comprising elemental W;
   annealing the fluorine containing layer at a temperature and for a time period which in combination are effective to drive fluorine from the fluorine containing layer into the polycrystalline thin film layer and incorporate fluorine within the grain boundaries to passivate said grain boundaries; and
   providing a transistor gate operatively adjacent the thin film transistor layer.

22. A method of forming a thin film transistor relative to a substrate comprising the following steps:
   providing a thin film transistor layer of polycrystalline material on a substrate, the polycrystalline material comprising grain boundaries;
   providing a fluorine containing layer adjacent the polycrystalline thin film layer, the fluorine containing layer comprising W and being deposited by chemical vapor deposition using $WF_6$ as a precursor;
   annealing the fluorine containing layer at a temperature and for a time period which in combination are effective to drive fluorine from the fluorine containing layer into the polycrystalline thin film layer and incorporate fluorine within the grain boundaries to passivate said grain boundaries; and
   providing a transistor gate operatively adjacent the thin film transistor layer.

23. A method of forming a thin film transistor relative to a substrate comprising the following steps:
   providing a thin film transistor layer of polycrystalline material on a substrate, the polycrystalline material comprising grain boundaries;
   providing a fluorine containing layer adjacent the polycrystalline thin film layer;
   annealing the fluorine containing layer at a temperature and for a time period which in combination are effective to drive fluorine from the fluorine containing layer into the polycrystalline thin film layer and incorporate fluorine within the grain boundaries to passivate said grain boundaries, the annealing temperature being less than 700° C.; and providing a transistor gate operatively adjacent the thin film transistor layer.

24. A method of forming a thin film transistor relative to a substrate comprising the following steps:

providing a thin film transistor layer of polycrystalline material on a substrate, the polycrystalline material comprising grain boundaries;

providing a fluorine containing layer adjacent the polycrystalline thin film layer;

providing a buffering layer intermediate the thin film transistor layer and the fluorine containing layer;

annealing the fluorine containing layer at a temperature and for a time period which in combination are effective to drive fluorine from the fluorine containing layer into the polycrystalline thin film layer and incorporate fluorine within the grain boundaries to passivate said grain boundaries, the buffering layer being transmissive of fluorine from the fluorine containing layer during the annealing step; and providing a transistor gate operatively adjacent the thin film transistor layer.

25. A method of forming a thin film transistor relative to a substrate comprising the following steps:

providing a thin film transistor layer of polycrystalline material on a substrate, the polycrystalline material comprising grain boundaries;

providing a fluorine containing layer adjacent the polycrystalline thin film layer;

providing a buffering layer intermediate the thin film transistor layer and the fluorine containing layer, the buffering layer having a thickness of less than or equal to about 200 Angstroms;

annealing the fluorine containing layer at a temperature and for a time period which in combination are effective to drive fluorine from the fluorine containing layer into the polycrystalline thin film layer and incorporate fluorine within the grain boundaries to passivate said grain boundaries, the buffering layer being transmissive of fluorine from the fluorine containing layer during the annealing step; and providing a transistor gate operatively adjacent the thin film transistor layer.

26. A method of forming a thin film transistor relative to a substrate comprising the following steps:

providing a thin film transistor layer of polycrystalline material on a substrate, the polycrystalline material comprising grain boundaries;

providing a fluorine containing layer adjacent the polycrystalline thin film layer, the fluorine containing layer predominately comprising elemental W; and annealing the fluorine containing layer at a temperature sufficiently high to drive fluorine from the fluorine containing layer into the polycrystalline thin film layer and incorporate fluorine within the grain boundaries to passivate said grain boundaries but sufficiently low to prevent chemical reaction of the fluorine containing layer with the polycrystalline thin film layer.

27. A method of forming a thin film transistor relative to a substrate comprising the following steps:

providing a thin film transistor layer of polycrystalline material on a substrate, the polycrystalline material comprising grain boundaries;

providing a fluorine containing layer adjacent the polycrystalline thin film layer, the fluorine containing layer comprising W and being deposited by chemical vapor deposition using $WF_6$ as a precursor; and annealing the fluorine containing layer at a temperature sufficiently high to drive fluorine from the fluorine containing layer into the polycrystalline thin film layer and incorporate fluorine within the grain boundaries to passivate said grain boundaries but sufficiently low to prevent chemical reaction of the fluorine containing layer with the polycrystalline thin film layer.

28. A method of forming a thin film transistor relative to a substrate comprising the following steps:

providing a thin film transistor layer of polycrystalline material on a substrate, the polycrystalline material comprising grain boundaries;

providing a fluorine containing layer adjacent the polycrystalline thin film layer; and annealing the fluorine containing layer at a temperature sufficiently high to drive fluorine from the fluorine containing layer into the polycrystalline thin film layer and incorporate fluorine within the grain boundaries to passivate said grain boundaries but sufficiently low to prevent chemical reaction of the fluorine containing layer with the polycrystalline thin film layer, the annealing temperature being less than 700° C.

29. A method of forming a thin film transistor relative to a substrate comprising the following steps:

providing a thin film transistor layer of polycrystalline material on a substrate, the polycrystalline material comprising grain boundaries;

providing a fluorine containing layer adjacent the polycrystalline thin film layer;

providing a buffering layer intermediate the thin film transistor layer and the fluorine containing layer, the buffering layer having a thickness of less than or equal to about 200 Angstroms; and annealing the fluorine containing layer at a temperature sufficiently high to drive fluorine from the fluorine containing layer into the polycrystalline thin film layer and incorporate fluorine within the grain boundaries to passivate said grain boundaries but sufficiently low to prevent chemical reaction of the fluorine containing layer with the polycrystalline thin film layer, the buffering layer being transmissive of fluorine from the fluorine containing layer during the annealing step.

* * * * *

UNITED STATES PATENT AND TRADEMARK OFFICE
CERTIFICATE OF CORRECTION

PATENT NO. : 5,665,611

DATED : September 9, 1997

INVENTOR(S) : Gurtej S. Sandhu et. al.

It is certified that error appears in the above-identified patent and that said Letters Patent is hereby corrected as shown below:

Col. 4, ln. 56: Replace "pre" with --preferred--.

Signed and Sealed this

Tenth Day of March, 1998

Attest:

BRUCE LEHMAN

*Attesting Officer*     Commissioner of Patents and Trademarks